(12) United States Patent
Ghariehali et al.

(10) Patent No.: US 9,478,429 B2
(45) Date of Patent: Oct. 25, 2016

(54) REMOVABLE TEMPLATES FOR DIRECTED SELF ASSEMBLY

(71) Applicant: MASSACHUSETTS INSTITUTE OF TECHNOLOGY, Cambridge, MA (US)

(72) Inventors: Amir Tavakkoli Kermani Ghariehali, Tehran (IR); Samuel Mospens Nicaise, Cambridge, MA (US); Karl K. Berggren, Arlington, MA (US); Kevin Willy Gotrik, Cambridge, MA (US); Caroline A. Ross, Arlington, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 368 days.

(21) Appl. No.: 13/800,435

(22) Filed: Mar. 13, 2013

(65) Prior Publication Data

US 2013/0244439 A1   Sep. 19, 2013

Related U.S. Application Data

(60) Provisional application No. 61/610,102, filed on Mar. 13, 2012.

(51) Int. Cl.
| | |
|---|---|
| *H01L 21/308* | (2006.01) |
| *G03F 7/00* | (2006.01) |
| *H01L 21/3105* | (2006.01) |
| *H01L 21/311* | (2006.01) |
| *H01L 21/027* | (2006.01) |
| *B81C 1/00* | (2006.01) |

(52) U.S. Cl.
CPC ....... *H01L 21/3081* (2013.01); *B81C 1/00031* (2013.01); *G03F 7/0002* (2013.01); *H01L 21/0271* (2013.01); *H01L 21/31058* (2013.01); *H01L 21/31138* (2013.01); *B81C 1/00111* (2013.01); *B81C 1/00428* (2013.01); *B81C 2201/0149* (2013.01)

(58) Field of Classification Search
None
See application file for complete search history.

(56) References Cited

U.S. PATENT DOCUMENTS

| 7,251,094 | B2 * | 7/2007 | Miyano .......................... 360/75 |
| 7,521,090 | B1 * | 4/2009 | Cheng et al. ................. 427/256 |
| 8,309,278 | B2 | 11/2012 | Yang et al. |
| 8,822,139 | B2 * | 9/2014 | Peeters et al. ................ 430/322 |
| 2009/0042146 | A1 * | 2/2009 | Kim et al. .................... 430/323 |

(Continued)

OTHER PUBLICATIONS

Ilievski, F. et al., "Graphoepitaxy of block copolymers using selectively removable templates," J. Vac. Sci. Technol. B 28(1), Jan./Feb. 2010, pp. 42-44.

(Continued)

*Primary Examiner* — Anita Alanko
(74) *Attorney, Agent, or Firm* — Talem IP Law, LLP

(57) ABSTRACT

A sacrificial-post templating method is presented for directing block copolymer (BCP) self-assembly to form nanostructures of monolayers and bilayers of microdomains. The topographical post template can be removed after directing self-assembly and, therefore, is not incorporated into the final microdomain pattern. The sacrificial posts can be a material removable using a selective etchant that will not remove the material of the final pattern block(s). The sacrificial posts may be removable, at least in part, using a same etchant as for removing one of the blocks of the BCP, for example, a negative tone polymethylmethacrylate (PMMA) when a non-final pattern block of polystyrene is removed and polydimethylsiloxane (PDMS) remains on the substrate.

20 Claims, 13 Drawing Sheets

(56) References Cited

U.S. PATENT DOCUMENTS

| | | | |
|---|---|---|---|
| 2009/0092803 A1 | 4/2009 | Bita et al. | |
| 2009/0263628 A1* | 10/2009 | Millward | 428/173 |
| 2012/0009390 A1* | 1/2012 | Yang | B81C 1/00031 428/179 |
| 2012/0135146 A1* | 5/2012 | Cheng | H01L 21/0337 427/271 |
| 2012/0138571 A1* | 6/2012 | Black | B81C 1/00031 216/41 |
| 2012/0196094 A1* | 8/2012 | Xu | G11B 5/746 428/195.1 |
| 2013/0252029 A1* | 9/2013 | Takizawa | G11B 5/855 428/800 |
| 2013/0266757 A1* | 10/2013 | Giron | C03B 33/0222 428/98 |
| 2013/0288482 A1* | 10/2013 | Nam | H01L 21/0273 438/703 |
| 2013/0318483 A1* | 11/2013 | Chang et al. | 716/55 |
| 2015/0050599 A1* | 2/2015 | Wuister et al. | 430/323 |
| 2015/0064917 A1* | 3/2015 | Somervell et al. | 438/703 |
| 2015/0252216 A1* | 9/2015 | Minegishi | C09D 153/00 427/265 |

OTHER PUBLICATIONS

Tavakkoli, A. et al., "Rectangular Symmetry Morphologies in a Topographically Templated Block Copolymer," Science, vol. 336, Jun. 8, 2012, pp. 1294-1298.

Tavakkoli, A. et al., "Templating Three-Dimensional Self-Assembled Structures in Bilayer Block Copolymer Films," Advanced Materials, 24, 2012, pp. 4249-4254.

* cited by examiner

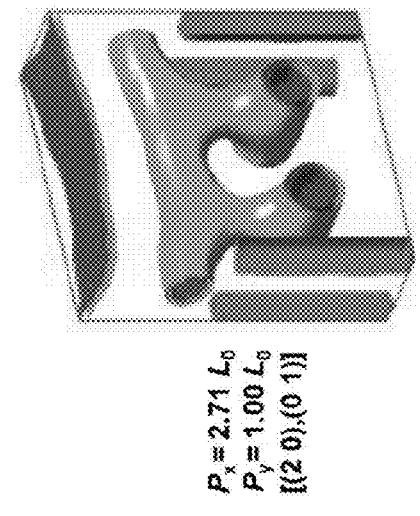
FIG. 18C
$P_x = 2.71\ L_0$
$P_y = 1.00\ L_0$
$[(2\ 0),(0\ 1)]$
FIG. 18B
$P_x = 1.71\ L_0$
$P_y = 1.00\ L_0$
$[(0\ 1),(1\ 0)]$
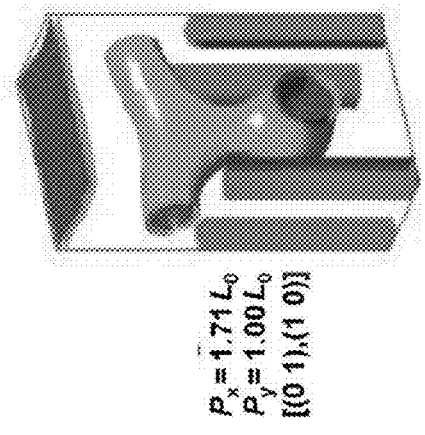
FIG. 18A
$P_x = 2.00\ L_0$
$P_y = 1.00\ L_0$
$[(2\ 0),(1\ 0)]$
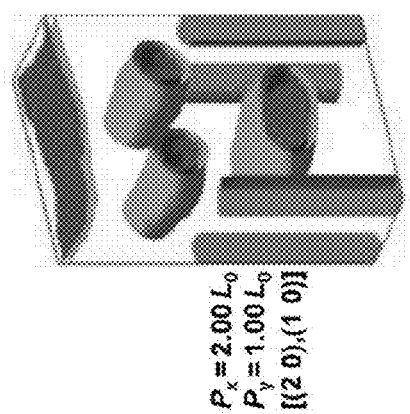
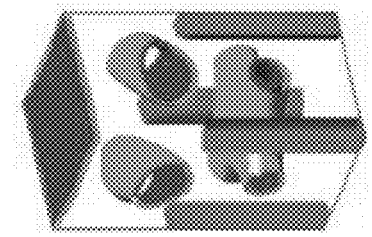
FIG. 18E
$P_y = P_x = 1.57\ L_0$
$[(-1\ 1),B]$
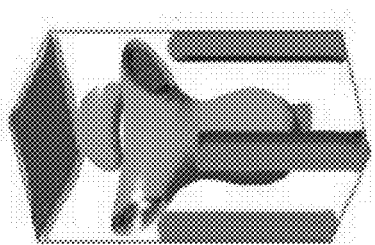
FIG. 18D
$P_y = P_x = 1.43\ L_0$
$[(1\ 1),S]$

REMOVABLE TEMPLATES FOR DIRECTED SELF ASSEMBLY

This invention was made with government support under Contract No. 70NANB7H6168 awarded by the National Institute of Standards and Technology, and under Contract No. HR0011-10-3-0002 awarded by the Defense Advanced Research Projects Agency. The government has certain rights in the invention.

BACKGROUND OF THE INVENTION

Production of dense, defect-free and uniform nanopatterns over a large area is of significant concern for the semiconductor fabrication industry. State-of-the-art fabrication techniques include photolithography (immersion optical and interference lithography) and scanning electron-beam lithography (SEBL). However these techniques are limited by factors such as low throughput due to the serial patterning nature of SEBL or lower inherent resolutions limits of optical lithography, which require solutions to challenging physics problems such as finding appropriate low wavelength light sources (EUV) and material systems that can properly act as resists for such light sources. Developing technology to overcome such limitations is of significant concern for the semiconductor fabrication industry in shrinking the size of transistors for integrated circuits.

A promising solution to overcoming such limitations is the directed self-assembly (DSA) of block copolymers (BCPs) through physical templating. BCPs are composed of chemically distinct polymer chains (blocks) that are covalently bonded at their ends. When a thin film coating of BCPs is annealed, the polymer self-assembles to form nano-scale structures due to microphase separation, often with dimensions in the range of 5 nm to 100 nm. The pattern templates made with BCPs can be used as a mask for further pattern transfer into functional materials such as insulating, semiconducting, and conducting materials.

BRIEF SUMMARY

Techniques related to DSA of BCPs and pattern transfer through removal of physical templating features for two-dimensional and three-dimensional structures are described.

According to an aspect, self-assembled BCP structures can be used as a functional pattern without interference from the physical templating features used to direct the patterns of the BCP.

A method of fabricating a self-assembled template is provided in which sacrificial posts are formed on a substrate. The sacrificial posts can be a material which is removable using a selective etchant that will not remove the material of the final pattern block(s), and may be removable, at least in part, using a same etchant as for removing other blocks of the BCP. In one embodiment, the sacrificial posts are formed of polymethylmethacrylate (PMMA) exposed at a dose that causes the PMMA to behave as a negative resist. Chemical functionalization of the sacrificial posts can optionally be performed. The chemical functionalization may be a surface layer of a majority block or minority block brush layer on the sacrificial posts.

The surface layer can be selectively applied to provide additional direction to the self-assembly of the BCP. The BCP can be applied to the substrate having the sacrificial posts and annealed to produce the desired morphologies directed by the arrangement of the sacrificial posts. An etching process can be performed to remove the non-final pattern block(s) and the sacrificial posts in order to leave only the final pattern block(s).

According to embodiments, the final pattern may cover an entire area on which a pattern is to be transferred. The final pattern can be transferred to the underlying substrate without artifacts from the physical template used to direct the self-assembled pattern.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 4A shows a cross-section and top view illustrating a step where the template is fabricated on the substrate; FIG. 4B shows a cross-section and top view illustrating a step where a thin film of BCP is spin coated and a solvent anneal is used to reach an assembly equilibrium; FIG. 4C shows a cross-section and top view illustrating a step where a short $CF_4$ and $O_2$ RIE etch is used reduce the system down to the final pattern; and FIG. 4D shows a cross-section and top view illustrating a step where the pattern is transferred into a desired substrate through direct etching.

FIG. 5A shows a cross-section and top view illustrating a step where the template is fabricated on the substrate; FIG. 5B shows a cross-section and top view illustrating a step where a thin film of BCP is spin coated and a solvent anneal is used to reach an assembly equilibrium; FIG. 5C shows a cross-section and top view illustrating a step where a short $CF_4$ and $O_2$ RIE etch is used reduce the system down to the final pattern; and FIG. 5D shows a cross-section and top view illustrating a step where the pattern is transferred into a desired substrate through direct etching.

FIG. 13A shows a square array of spheres at pitch $L_0$; FIG. 13B shows a square symmetry perforated lamella L1 for post pitch of $1.71L_0$; FIG. 13C shows a square symmetry perforated lamella L2 for pitch $1.86L_0$; and FIG. 13D shows a hexagonal symmetry perforated lamella L2 for pitch $2.67L_0$. FIGS. 13A-13C are each made as a composite of 9 identical images and FIG. 13D is made as a composite of 6 identical images to show the geometry more clearly. $L_0$ is the PDMS cylinder pitch in the untemplated BCP.

In FIG. 14A, multiple data points for a given post pitch represent templates with different post diameters. In FIG. 14B, multiple data points for a given post diameter represent templates with different post pitch. In both simulation and experimental results, the generated-hole diameter does not vary much with post pitch and diameter, whereas the post-hole diameter increases linearly with post pitch and diameter. For experimental data, HSQ posts were used instead of PMMA posts. Open triangles and squares represent simulated structures with defects.

FIG. 16A shows a mesh of rectangular holes from a template with period 35 nm and 96 nm along they and x-directions, respectively; and FIG. 16B shows a mesh of bimodal rectangular holes from a template with period 36 nm and 136 nm along the y and x-directions, respectively. Light grey represents the ox-PDMS and dark grey represents the substrate. Insets show the locations of negative-tone PMMA posts, and the outlines represent unit cells for the nanostructures.

FIGS. 18A-18E show SCFT simulation results depicting parallel cylinders (FIG. 18A), perpendicular mesh-shaped structures (FIGS. 18B and 18C), cylinders over spheres (FIG. 18D), and cylinders over perforated lamellae (FIG. 18E).

DETAILED DISCLOSURE

Figure 1:
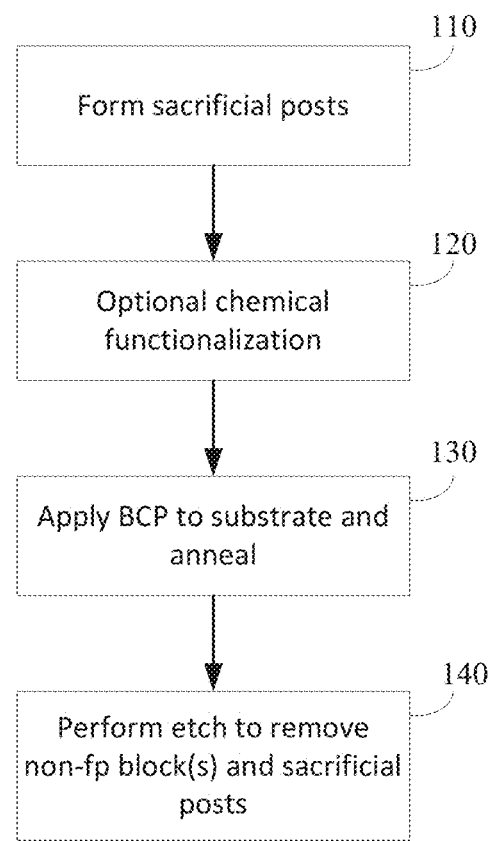
FIG. 1 shows a process flow diagram for a method of fabricating a self-assembled template using sacrificial posts according to an embodiment of the invention.

Block copolymers (BCPs) are copolymer systems in which a first block is a chain of $N_A$ repeating units of type A covalently linked to at least a second block that is a chain of $N_B$ repeating units of type B. A BCP of block A and block B is known as a diblock copolymer. In most cases the blocks are of polymers of sufficiently different structure that phase mixing does not occur and phase separation defines the morphology and properties of the block copolymer.

The specific nature of the blocks, size of the blocks and number of blocks can be controlled to impose a desired morphology to the system. Characteristic diblock copolymer morphologies (i.e., known equilibrium mesophases) include spheres, cylinders, gyroid, and lamellae.

Numerous studies have shown that it is possible to direct the microphase separation in BCP thin films using chemical or physical templating methods to produce a single layer of a bilayer of microdomains with complex and well-ordered nanostructures. That is, to impose long-range order and generate microdomain geometries not observed in films formed on unpatterned substrates, substrate features, such as chemical or topographical patterns, may function as a template, or guide, for block copolymer self-assembly in a top-down nano-scale fabrication technique to direct the assembly of smaller features.

Templating refers to the use of underlying substrate guides, air interfaces, and/or shear or electrical forces to direct self-assembled structures. Microdomains refer to regions of self-assembled and chemical structures having similar characteristics—either through guided templates or as a result of random self-assembly.

Topographical templating using nanoscale posts has been shown to promote a range of non-bulk morphologies from a given BCP and to produce pattern density multiplication in which the areal density (feature size per unit area) of microdomains exceeds that of the templating features.

In general, for topographical templating, the template becomes incorporated into the BCP microdomain array. Thus, when transferring a final pattern to the underlying substrate, both the topographical template and the BCP microdomain array are used as the pattern mask.

Embodiments provide a sacrificial-post templating method for block copolymer self-assembly, which produce geometries not previously realized by physical or chemical templating such as 3D grid patterns and arrays of holes with bimodal size distributions. Furthermore, sacrificial-post templating can integrate with current (and potentially future) semiconductor manufacturing processes because the templates can be made using optical lithography and trim etching (in addition to the e-beam lithography described in specific examples presented herein).

The use of a removable template can mitigate potential pattern transfer difficulties caused by the dissimilar etch rates for physical templates compared to the BCP nanopatterns. However, it is not sufficient to merely provide template features that are removable; rather, to facilitate implementation of self-assembled patterns for transferring patterns to underlying substrates, templates having particular feature sizes and pitches with respect to the period of the block copolymer are used.

According to embodiments of the invention, removable post templates are used to assist with directing the self-assembly of BCPs. Post templating differs from trench templating in many respects, and makes use of arrays of posts with lateral dimensions on the order of the half the (equilibrium) period of the block copolymer to create a range of complex microdomain patterns including several morphologies on a single substrate and bilayer meshes.

The morphology of thin film block copolymer (BCP) microdomains can transition between various non-bulk geometries by templating the BCP film using topographical features such as chemically-functionalized posts. Furthermore, this templating method can be applied to form more complex structures, including two-layer films. Prior work involving post templating involves fabricating the posts using an inorganic resist material, such as hydrogen silsequioxane (HSQ) resist.

Example BCP layers involve polystyrene (PS) and polydimethylsiloxane (PDMS). After removing one block (for example, a majority block of PS), the resulting nanopatterns consist of both the remaining minority block (for example, the PDMS when the PS is removed) and the post template (HSQ). The posts and the BCP microdomains will generally be chemically different and will have a dissimilar etch rate, and therefore could present nonuniformities in subsequent pattern-transfer and difficulties in device fabrication. That is, HSQ is etch resistant, which results in the post being incorporated into the BCP pattern.

Instead of HSQ, embodiments use posts fabricated from an organic resist, polymethylmethacrylate (PMMA), which enables the posts to be removed along with the PS block of a polystyrene-polydimethylsiloxane (PS-b-PDMS) BCP in an oxygen etch, leaving only the PDMS microdomains behind. Other carbon-based polymer materials may be used as the sacrificial post. In addition, while BCPs are discussed in detail herein, certain embodiments contemplate the use of linear or star triblock terpolymers and even multiblock copolymers, rod-coil copolymers, comb copolymers and other architectures.

Embodiments show the templating of PDMS nanostructures including in-plane cylinders, spheres, ellipsoids, and superstructures; preformed lamellae and rectangular meshes with holes of different diameters, symmetries (square and hexagonal), shapes (square, circular, rectangular, and hexagonal) and bimodal hole sizes; and with two- and three-fold pattern multiplication.

According to certain embodiments of the invention, a sacrificial-post templating method is provided for directing BCP self-assembly in which the topographic posts are made from a removable resist. The physical post-template is removed along with the majority block, and therefore the post template is not incorporated into the final pattern. This methodology can be used to fabricate nanoscale features in different shapes, lattices, and sizes from one BCP.

Figure 2A:
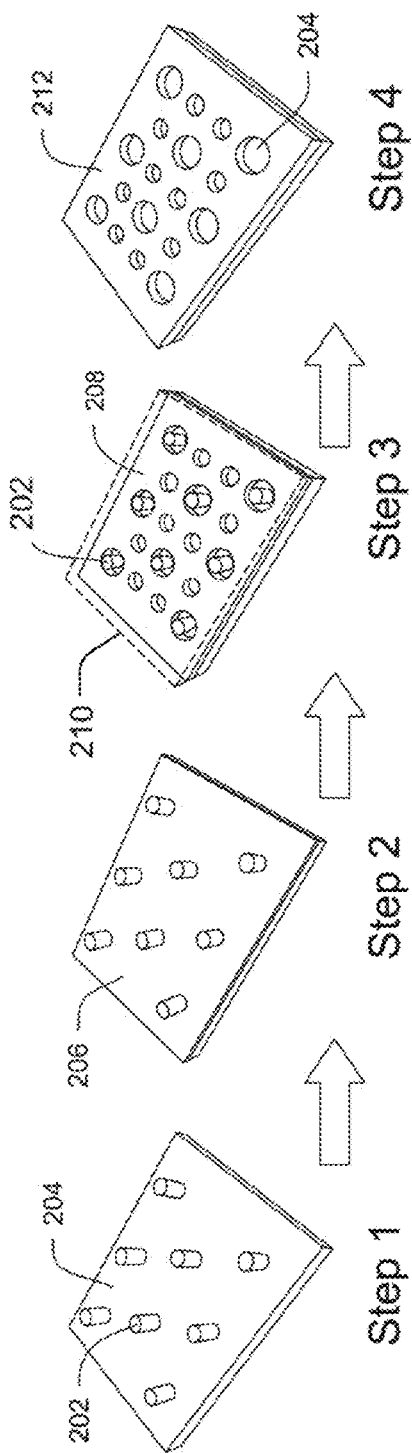
FIGS. 2A and 2B illustrate the method steps of FIG. 1 for a monolayer structure and bilayer structure, respectively, for a specific implementation.
Figure 2B:
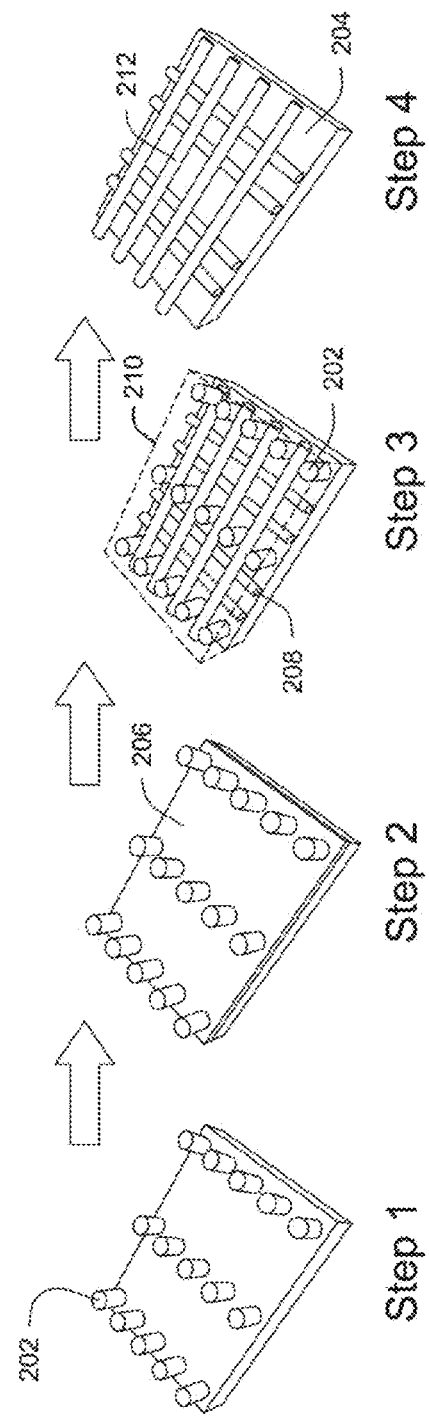

FIG. 1 shows a process flow diagram for a method of fabricating a self-assembled template using sacrificial posts according to an embodiment of the invention. FIGS. 2A and 2B illustrate the method steps of FIG. 1 for a monolayer structure and bilayer structure, respectively, for a specific implementation.

Referring to FIG. 1, a sacrificial post template can be fabricated through a photolithography or electron-beam-lithography exposure process (110). The sacrificial posts can be formed of a polymer having a relatively high etching selectivity to the block(s) not being removed during the templating while having a similar etch-ability as the block(s) being removed (referred to herein as the non-final pattern or "non-fp" block(s)). The materials being removed can also be selected to minimize damage to the materials remaining In some cases, the sacrificial posts can be formed of resists and antireflective coatings suitable for UV lithography. In the examples described herein, an electron-beam-lithography exposure process is used.

For example, as shown in FIGS. 2A and 2B, exposure of poly(methyl methacrylate) (PMMA) as a negative-tone resist can be performed to create sacrificial posts 202 on a substrate 204 in a pattern suitable for self-assembly of a BCP in a desired pattern. Depending on the spacing of the rectangular array of sacrificial posts, the BCP cylinders self-assemble in particular orientations with respect to the lattice formed by the array of sacrificial posts in order to maintain their equilibrium spacing and satisfy commensuration.

By using a rectangular lattice of sacrificial posts with lattice parameters $L_x$ and $L_y$, the order and orientation of the BCP cylinders (or other morphologies) (with equilibrium period $L_o$) can be controlled based on the commensuration condition between $L_o$, $L_x$ and $L_y$. In the case when $L_o=L_x$, the cylinders may orient along the y-axis, but as $L_x$ increases (and given $L_o=(1/L_x^2+1/L_y^2)^{-1/2}$), the BCP cylinders may begin to align diagonally. Thus, sacrificial posts having a spacing commensurate or integer multiples with the equilibrium periodicity of the BCP can control the orientation and shapes of the features. Commensurability in both x and y directions plays a dominant role in determining the particular morphology that forms. In addition, it is possible to direct the formation of bends, junctions and other aperiodic features in specific locations by adjusting the distribution of the sacrificial posts.

In extension to commensurability with the equilibrium period $L_o$, confinement of the block polymers within the post array can be used to direct formation of device and pattern features. Accordingly, a variety of mono- and bilayer patterns can be achieved using a template lattice with different lattices, periods, and diameters of the posts.

Figure 3:
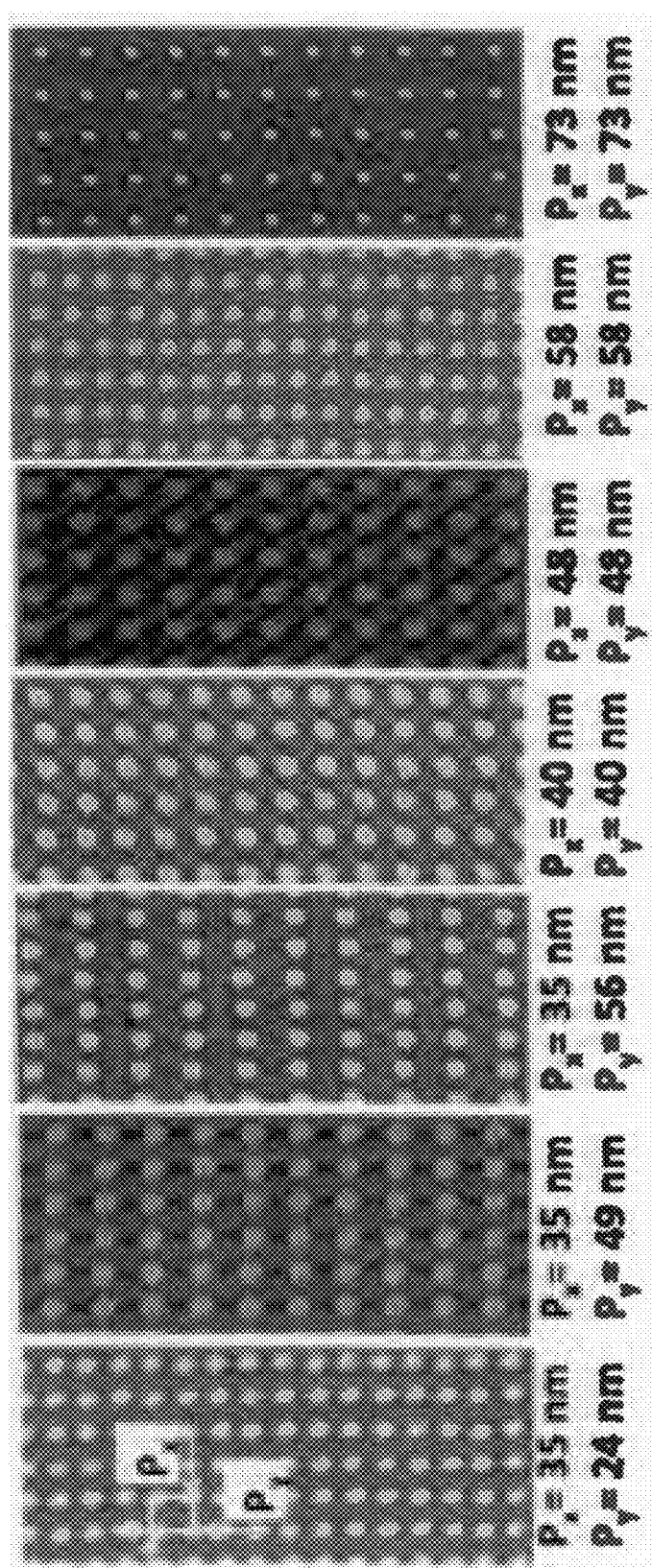
FIG. 3 shows Scanning Electron Micrograph (SEM) images of different morphologies of PDMS microdomains. The observed morphologies are cylinders, undulated cylinders, spheres, ellipsoids, periodic superstructures, perforated lamellae and double cylinders. The functionalized posts and the oxidized-PDMS (ox-PDMS) appear white and light grey, respectively. $P_x$ and $P_y$ signify the pitches in the x and y directions respectively.

FIG. 3 shows SEM images of different morphologies of PDMS microdomains. The observed morphologies are cylinders, undulated cylinders, spheres, ellipsoids, periodic superstructures, perforated lamellae and double cylinders. The functionalized posts and the oxidized-PDMS (ox-PDMS) appear white and light grey, respectively. $P_x$ and $P_y$ signify the pitches (e.g., $L_x$ and $L_y$) in the x and y directions, respectively.

In some cases, the sacrificial posts can be chemically functionalized for a particular block of the BCP (120). Chemical functionalization increases the affinity of the sacrificial posts and/or the substrate for one of the blocks of the BCP and can improve annealing kinetics.

For example, PMMA posts 202 can be chemically functionalized with, for example, a hydroxyl-terminated PS brush 206, as shown in FIGS. 2A and 2B. The PS-brush is a surface-confined macromolecular architecture where the PS chains are attached to the substrate surface by one end in close proximity, which forces the chains to stretch out into an extended conformation to minimize segment-segment overlaps. A PS-brush can be used to attract PS blocks to the substrate and favor PS over the other polymer block(s) of the BCP. In other embodiments, where other configurations are desired, a different brush or no brush may be used.

BCP layers can then be formed at the air and substrate interfaces by spin-coating the BCP on the substrate and then annealing (130). The annealing is performed under conditions to cause phase separation of the BCP. For example, for a BCP with cylindrical morphology, the annealing can cause formation of self-assembled cylinders of one block of the BCP in a matrix of the other block of the BCP. For a BCP with lamellae morphology, the blocks may be in equal parts or minority/majority parts where one (the non-fp block) is etched and the other remains to provide the final pattern. Therefore, when the block being etched is referred to as the "matrix" block, it should be understood that embodiments of different morphologies may involve removing one or more blocks that are not in matrix form. Referring to FIGS. 2A and 2B, the BCP can be a PS-b-PDMS BCP having cylindrical-morphology with PDMS 208 as the minority block in a PS matrix 210. The PS-b-PDMS BCP can be spin cast onto the substrate with the PMMA post templates and then annealed, for example, in cosolvent vapor of 5 parts toluene to 1 part heptane.

After annealing, an etching step can be performed to remove the matrix block (or other non-fp block) while leaving the BCP cylinders/patterns (140). According to embodiments of the invention, during the etching step, both the non-fp block(s) and the sacrificial posts are removed. Referring again to FIGS. 2A and 2B, an oxygen reactive ion etch (RIE) can be used to remove the PS block 210 and PMMA templates 202 and leave the oxidized-PDMS patterns 212 on the substrate 204. A variety of mono- and bilayer structures can be achieved using template patterns with different lattices, periods, and diameters of the posts. Examples of lattices, periods and diameters of the posts used in the implementations provided herein are provided in Table 1 following the examples below.

Thus, in comparison to previous chemical methods for forming nano-structures, the number of steps is decreased and the possibility of fabrication of three-dimensional structures is provided.

According to one aspect, because the physical template is removed, the final pattern is only the block copolymer (or one or more block polymers), which mitigates potential defects, imperfections, or processing inconsistencies caused from the original physical template during pattern transfer.

According to another aspect, the entire substrate surface can be filled with a pattern without conceding space to a physical template used for the directed BCP self-assembly.

According to certain embodiments, by removing the physical template of the sacrificial posts, only a single material may remain on the substrate to function as an etch mask for pattern transfer. A single material (or composition) can be etched uniformly. Uniform etch ratios can result in a more uniform pattern transfer. When the template features remain, differing etch ratios can result in pattern transfer difficulties.

A sacrificial post-templating method is provided that avoids the incorporation of the physical templates used to guide BCP self-assembly into final BCP nanopatterns.

By using a majority block brush layer on the sacrificial posts, the removable PMMA post array templated structures result in similar structures to those formed from an HSQ post array with the same geometry. This can be accomplished because the majority brush layer on the posts leads to the same boundary conditions on the self-assembly of the BCP irrespective of the post material. It is contemplated that other materials may successfully be used as sacrificial layers through a similar process. In addition, it is contemplated that different surface-modifying molecules may be used to direct which polymer has an affinity for a region.

Embodiments are applicable to the fabrication of both monolayers of in-plane microdomains, including spheres, cylinders and perforated lamellae, and bilayers of cylinders forming a mesh structure. In addition, pattern multiplication is achievable.

Perforated lamellae with bimodal hole sizes can be fabricated and used to make hole arrays with bimodal size distribution and square, rectangular or hexagonal symmetries. As explained in more detail in the examples, one set of holes has a diameter that is almost independent of template geometry while the other set of holes has a diameter that increases with post diameter or pitch.

Embodiments of the invention can be applied to semiconductor fabrication applications such as metal via patterning; biomolecule templating; nanowire and nanotube growth; subwavelength photonics; electronic devices; as well as other applications. For example, embodiments may be applicable to thermodynamically-driven self-assembly systems at similar nano-length-scales. Further examples of applications include, but are not limited to, transistors, memristors, integrated circuit (IC) interconnects, bio templates, solar cells, filtration, magnetic memory, stepper masks for ICs, anti-reflection coatings, nanoparticle and other nanostructure synthesis and placement, plasmonic devices, fabrication of other nanostructures, nanoimprint master fabrication, flash memory, vias in IC fabrication, photonic crystals, and catalyst arrays for wire growth.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

EXAMPLE

Figure 4A:
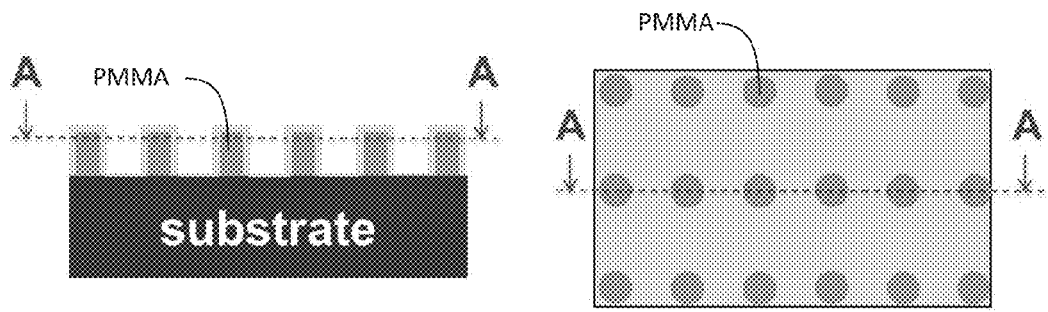
FIGS. 4A-4D show a process for the directed self-assembly of BCP within a removable template and an example of the resulting pattern transfer.

Comparison Sacrificial Post Templated BCP Pattern vs. Non-sacrificial Post Templated BCP Pattern Post-arrays of negative-tone 29-40 nm thick PMMA were fabricated on a silicon substrate through electron-beam-lithography using a RAITH-150 tool at 30 keV, at high enough doses to cross-link PMMA as a negative tone resist. A cross-section and top view image is shown in FIG. 4A. After development, ultrasonication in acetone was used to remove the non-exposed PMMA resist. The posts were then chemically functionalized with a hydroxyl-terminated polystyrene- (PS-) brush (1 kg mol$^{-1}$).

Using a PS-brush (majority block) makes the PS-block attracted to the post template. Also, a PS-brush can be used to form a rich variety of three-dimensional structures including cylinder arrays with controllable angles, bends, and junctions whose geometry is controlled. The PS-brush can also change the morphology of the BCP pattern and form different morphologies on a single substrate such as shown in FIG. 3, which shows images of different morphologies created based on the post arrangement and PS-brush.

Figure 4B:
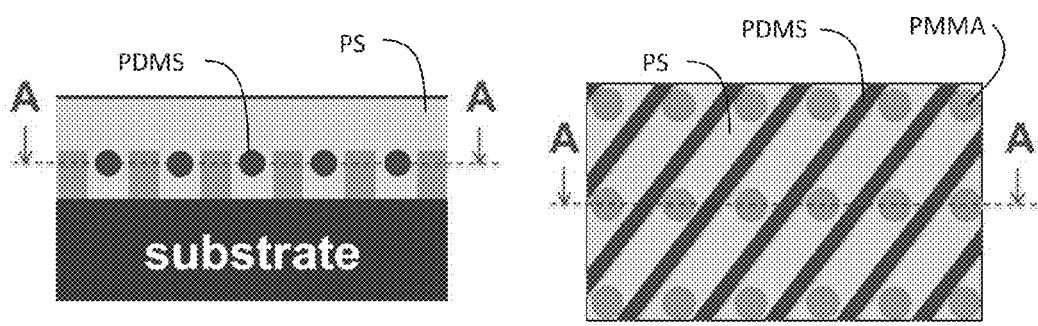
Figure 4C:
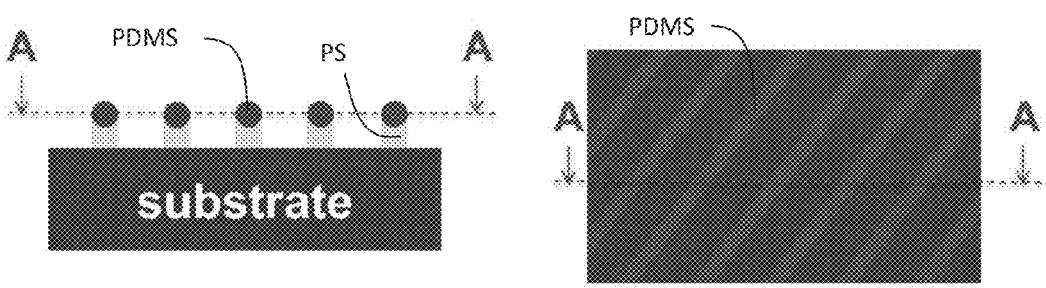
Figure 4D:

Returning to FIG. 4B, PS-b-PDMS (45.5 kg/mol) cylindrical-morphology thin film was spun cast over the substrate and solvent annealed in the presence of toluene and heptane vapors (with a 5:1 volume ratio). The PS-b-PDMS was directed within the PMMA post-array to form different two-dimensional and three-dimensional structures dependent on the chosen post periodicity, BCP thickness and arrangement. A 5 second CF$_4$ reactive ion etch (RIE) was performed to remove the top PDMS wetting layer. This etch was immediately followed by a 22 second O$_2$ RIE to remove the PS block and PMMA posts as shown in FIG. 4C. The final directed pattern was oxidized PDMS, devoid of PS and the original PMMA template, as shown in FIG. 4D.

Figure 5A:
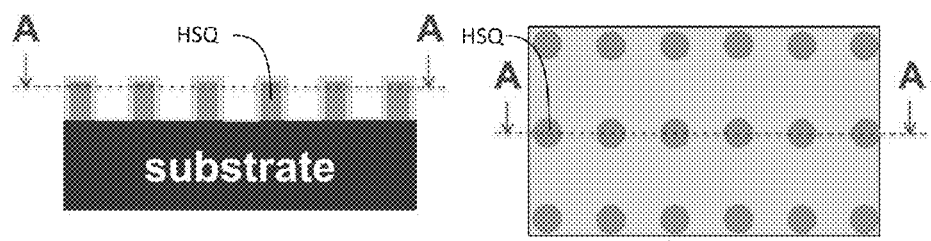
FIGS. 5A-5D show a process for the directed self-assembly of BCP within a non-removable template (hydrogen silsesquioxane resist, HSQ) and an example of the resulting pattern transfer.
Figure 5B:
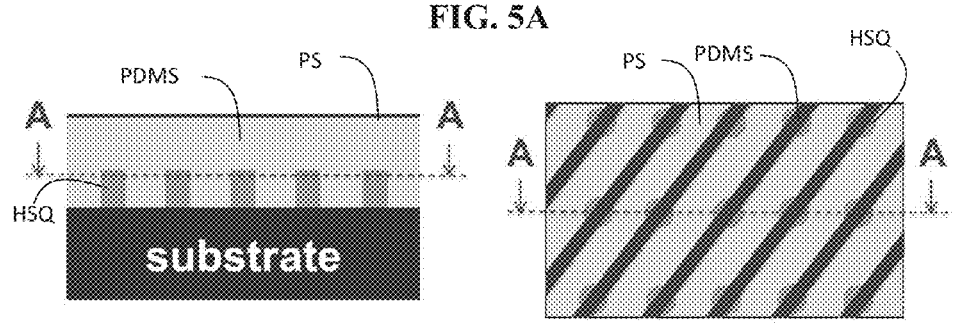
Figure 5C:
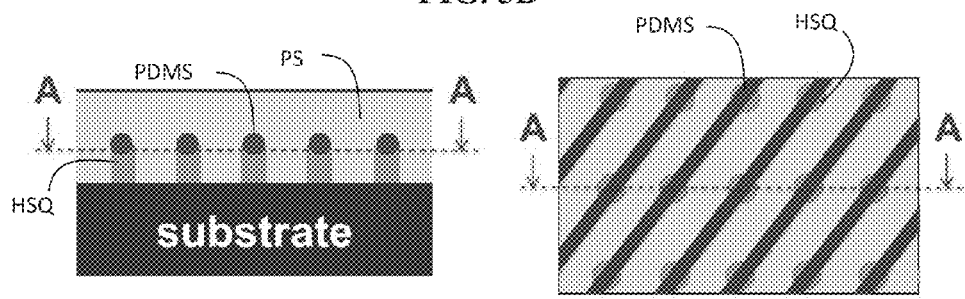
Figure 5D:
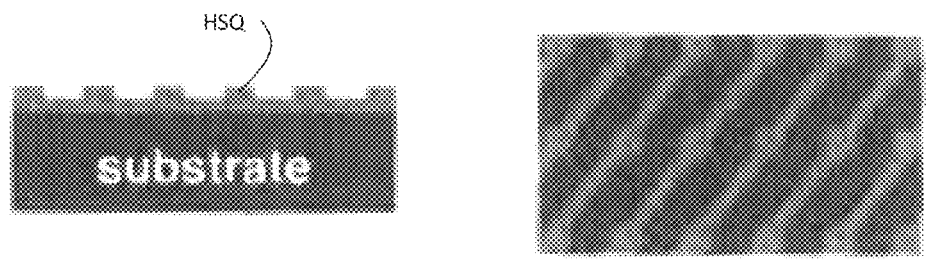

FIGS. 5A-5D show a process using typical non-removable template posts for a similar grating structure as described with respect to FIGS. 4A-4D. Similar steps were performed as in FIGS. 4A-4C, but instead of forming the PMMA resist to create the posts, HSQ posts were fabricated before applying a PDMS-brush and spin coating and solvent annealing a PS-b-PDMS cylindrical morphology thin film on the substrate. FIG. 5C shows a final pattern after the RIE etch with posts remaining FIG. 4C and FIG. 5C are contrasted by an example of using the final patterns as anisotropic etch masks into the substrates. The use of a removable post template has the potential to result in a more uniform etch into the substrate (FIG. 4D) as opposed to the uses of a non-removable post template (FIG. 5D).

Advantageously, the template posts are not within or part of the final BCP pattern after etching. When this post template is removed through this technology, the final directed pattern can cover 100% of the template area and presents a better replica of the remaining BCP. Accordingly, embodiments provide a method for fabricating a homogenous BCP etch mask that can cover 100% (or substantially all) of the template area through graphoepitaxy.

EXAMPLE

Mesh Forming Cylinders

To illustrate the feasibility of 3-D structures (including the bilayer morphology shown in FIG. 2B), a templating process using HSQ was carried out and the results illustrated in the SEM images of an etched 3D-structure on a substrate found in FIGS. 6A-6D. It should be understood that this process can be carried out using sacrificial posts as well and additional examples are provided and described with respect to FIGS. 16A and 16B.

In particular, HSQ was spin coated at 40±2 nm thickness on Si (100) substrates. The post array templates were fabricated by means of electron-beam lithography of the HSQ resist at an acceleration voltage of 30 kV, beam current of 300 pA, and dot doses of 40 to 116 fC. After development and HSQ hardening by use of an oxygen plasma asher, the final post height was 33±2 nm. Next, the substrates and posts were chemically functionalized with hydroxyl terminated polystyrene (1 kg mol$^{-1}$, 2 nm thick), which corresponds to the majority block of the block copolymer. A cylindrical-morphology PS-b-PDMS block copolymer (45.5 kg mol$^{-1}$, fraction of PDMS=32%) was spin coated onto the substrates with the post templates to a thickness of 42±1 nm. Solvent vapor annealing of the block copolymer thin film was done using a 5:1 volume ratio mixture of toluene and heptane, which resulted in swelling the BCP film to 101±3 nm (~3L$_0$) and resulted in the formation of a bilayer of in-plane PDMS cylinders in a PS matrix with in-plane periodicity (L$_0$) of about 36 nm. At the end of the solvent vapor anneal, a rapid quench was done within 1 s. Lastly, an oxygen reactive ion etch was used to remove the PS block, further reducing the film thickness and revealing the oxidized PDMS (ox-PDMS) patterns.

Figure 6A:
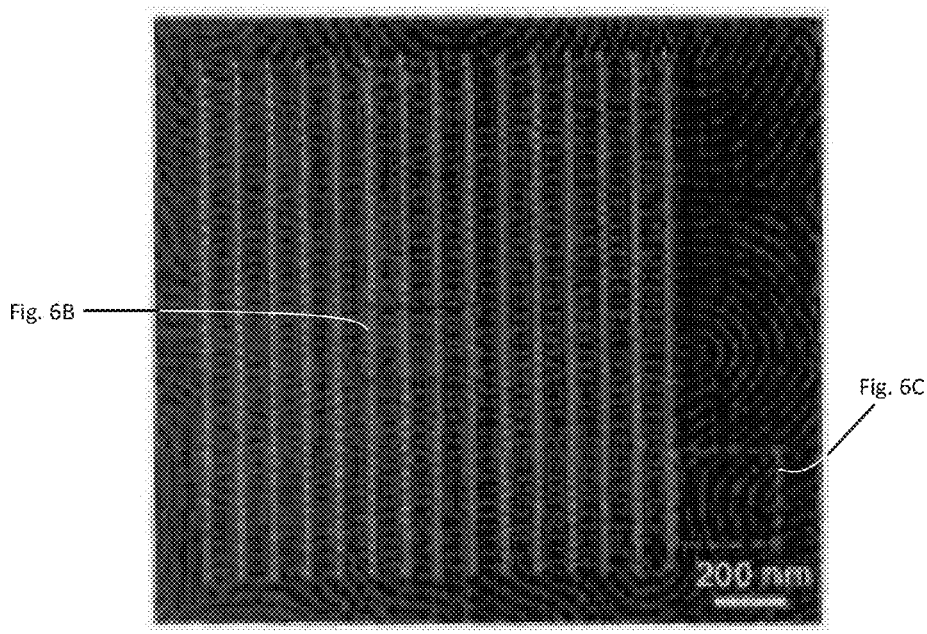
FIGS. 6A-6D show SEM images of an etched 3D-structure on a substrate; included are magnified and cross-sectional SEMs of the regions inside and outside the post-templated region.
Figure 6B:
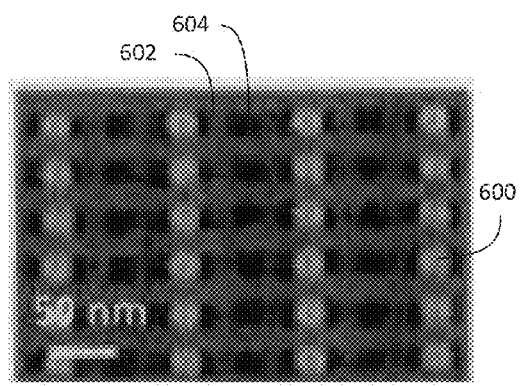
Figure 6C:
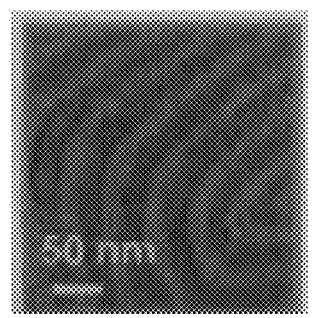
Figure 6D:
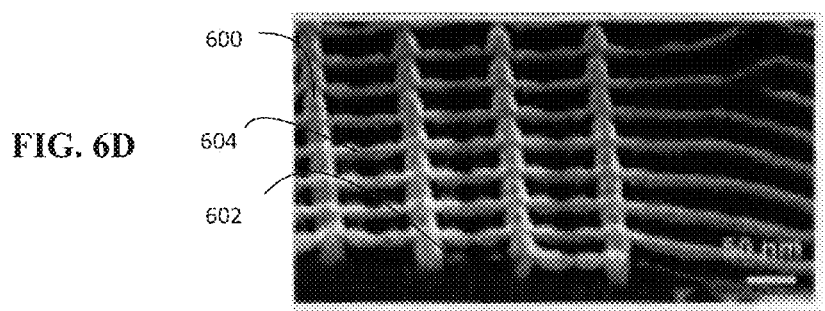

FIG. 6A shows a bilayer film templated by a rectangular array of PS-functionalized posts 21 nm in diameter and 33 nm in height, with x direction periodicity of 100 nm and y direction periodicity of 36 nm. FIGS. 6B-6D show magnified images and perspective SEMs of regions inside and outside the templated region shown in FIG. 6A.

As illustrated in FIGS. 6A, 6B and 6D, two layers of cylinders, structures 602 and 604, are clearly visible in scanning electron micrographs (SEMs) after etching and are oriented with respect to the lattice vectors of the post lattice, corresponding to the array of guide features 600. Without wishing to be bound by theory, the observed PDMS cylinders typically lie between the PS coated posts because the PS brush attracts the styrene/majority block of the copolymer.

As illustrated in FIGS. 6A and 6C, outside the templated region, the top and bottom layers of the ox-PDMS cylinders have substantially the same local orientation, with the cylinders in the top layer lying in between those of the bottom layer. Further, outside of the template region, there is no observed long-range order. In contrast, and without wishing to be bound by theory, inside the templated region, the cylinders in the top and bottom layers do not generally have the same local orientations between the posts because of the energetic cost associated with incommensurability. As a result, as illustrated in FIGS. 6A, 6B and 6D, the top cylinders instead self-assembled into a mesh-like array of perpendicular cylinders that covered the entire templated region.

EXAMPLES

BCP Self-Assembly with Template of Sacrificial Posts

Monolayer Microdomain Morphologies Vs. Post Spacing.

FIGS. 7, 8, 9, 10, 11A, 11B, 12A, and 12B show the experimental results of the fabrication of monolayer structures using the sacrificial-post templating method such as described with respect to FIG. 2A in which (Step 1 ) represents electron-beam lithography fabrication of arrays of posts, (Step 2) represents functionalization of posts and substrates with a PS brush, (Step 3) represents spin coating and solvent annealing of the PS-b-PDMS BCP thin film, and (Step 4) represents RIE removal of the top PDMS layer with $CF_4$ followed by PS matrix and PMMA posts removal with $O_2$. The ox-PDMS nanostructure remained on the substrates as the final nanopatterns.

The middle of each image shows regions where the sacrificial-posts were present whereas the outer boundary (e.g., left and right sides of the images) is representative of unpatterned areas which were covered with randomly oriented in-plane cylinders. Insets in these figures show the locations of PMMA posts before removal by the $O_2$ RIE.

Figure 7:
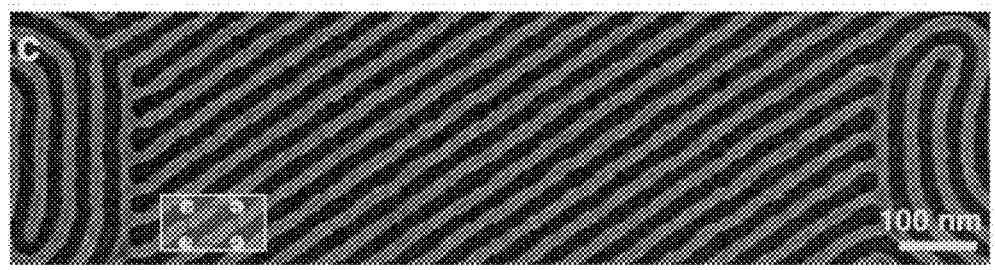
FIG. 7 is a SEM image of a monolayer nanostructure fabricated by the sacrificial-post templating method showing in-plane cylinders. Light grey represents ox-PDMS and dark grey represents the substrate. Inset shows the pre-removal locations of negative-tone PMMA posts, with the outlines representing unit cells for the final nanostructures
Figure 11A:
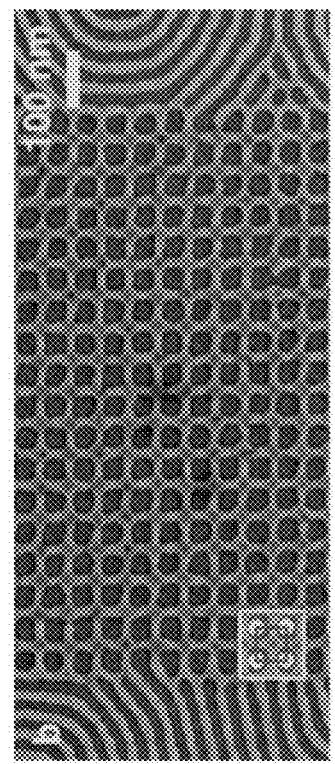
FIG. 11A is a SEM image of a monolayer nanostructure fabricated by the sacrificial-post templating method showing a square symmetry L1 perforated lamella. Light grey represents ox-PDMS and dark grey represents the substrate. Inset shows the pre-removal locations of negative-tone PMMA posts, with the outlines representing unit cells for the final nanostructures.
Figure 11B:
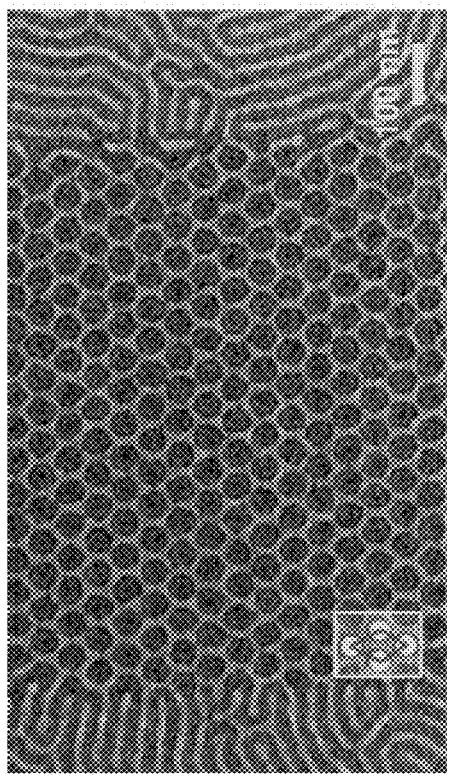
FIG. 11B is a SEM image of a monolayer nanostructure fabricated by the sacrificial-post templating method showing a hexagonal array of nanoholes (L1 perforated lamella). Light grey represents ox-PDMS and dark grey represents the substrate. Inset shows the pre-removal locations of negative-tone PMMA posts, with the outlines representing unit cells for the final nano structures.
Figure 12A:
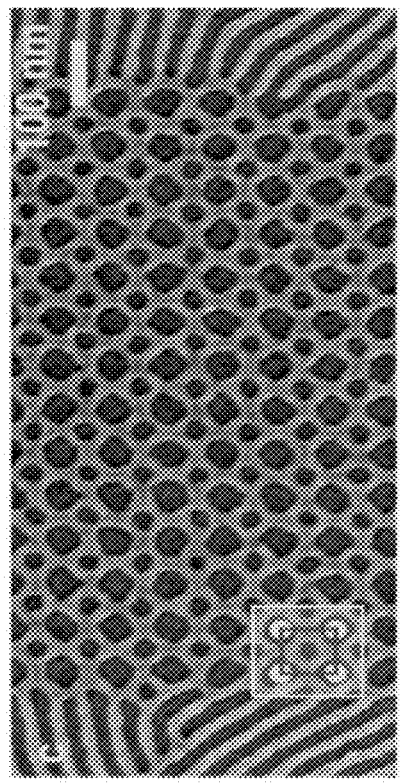
FIGS. 12A and 12B are SEM images of a monolayer nanostructure fabricated by the sacrificial post templating method respectively showing square symmetry L2 perforated lamella with one hole generated between each group of four posts and hexagonal symmetry L2 perforated lamella of nanoholes with one hole generated between each group of three posts. Light grey represents ox-PDMS and dark grey represents the substrate. Insets show the pre-removal locations of negative-tone PMMA posts, with the outlines representing unit cells for the final nano structures.
Figure 12B:
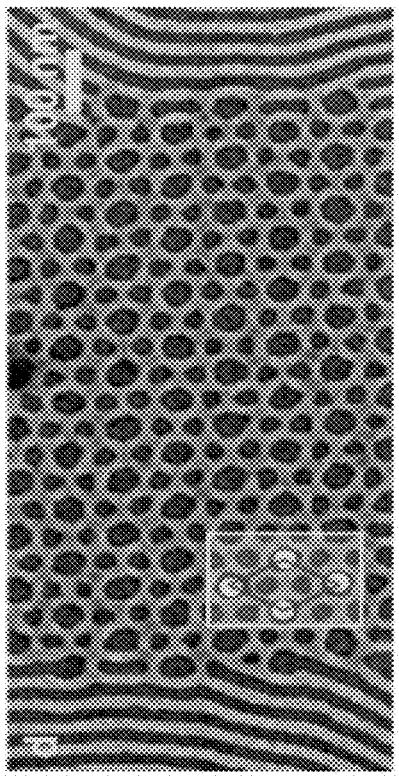

The microdomains of the BCP transitioned between multiple morphologies as a function of the post pitch. For example, increasing the pitch for a square or rectangular symmetry post array resulted in in-plane cylinders as shown in FIG. 7 (where different directions of gratings can be achieved depending on the periodicity of the absent PMMA template posts); transitioning to spheres as shown in FIG. 8, ellipsoids as shown in FIG. 9; periodic superstructures FIG. 10; perforated lamellae (L1) where each post corresponds to one hole as shown in FIGS. 11A and 11B; and perforated lamellae with additional generated pores that appeared in between the posts (L2) as shown in FIGS. 12A and 12B.

Figure 8:
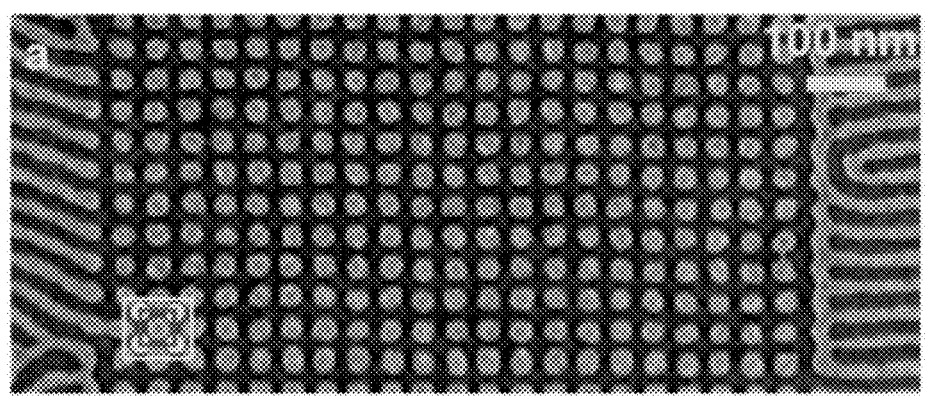
FIG. 8 is a SEM image of a monolayer nanostructure fabricated by the sacrificial-post templating method showing a square array of spheres. Light grey represents ox-PDMS and dark grey represents the substrate. Inset shows the pre-removal locations of negative-tone PMMA posts, with the outlines representing unit cells for the final nanostructures.
Figure 9:
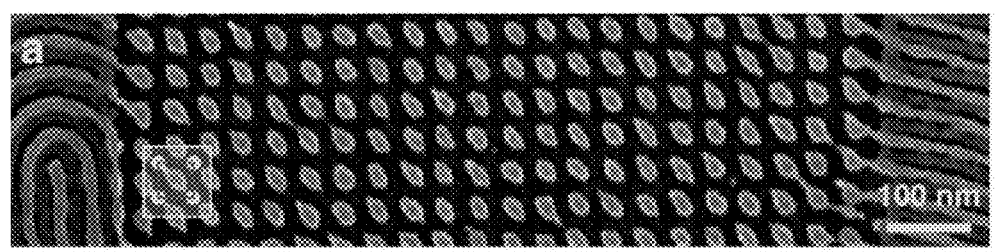
FIG. 9 is a SEM image of a monolayer nanostructure fabricated by the sacrificial-post templating method showing arrays of elliptical nanoposts. Light grey represents ox-PDMS and dark grey represents the substrate. Inset shows the pre-removal locations of negative-tone PMMA posts, with the outlines representing unit cells for the final nanostructures.
Figure 10:
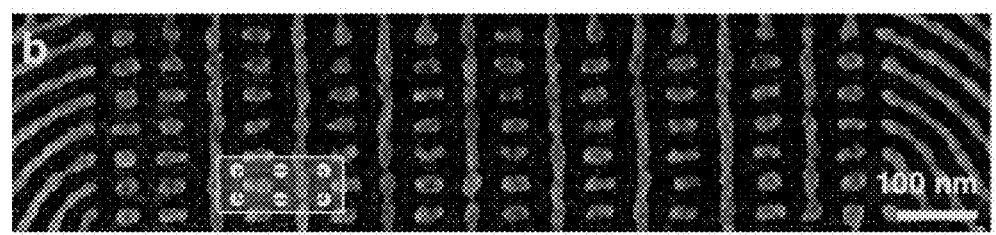
FIG. 10 is a SEM image of a monolayer nanostructure fabricated by the sacrificial-post templating method showing a periodic-superstructure. Light grey represents ox-PDMS and dark grey represents the substrate. Inset shows the pre-removal locations of negative-tone PMMA posts, with the outlines representing unit cells for the final nanostructures.

In the sphere array shown in FIG. 8, the PDMS spheres had similar diameter to the PMMA posts. The holes in the perforated lamellae were not necessarily circular, e.g. FIGS. 11A and 12A show holes with a rounded square shape. Hexagonal post arrays also led to L1 and L2 perforated lamellae with hexagonal symmetry as shown in FIGS. 11B and 12B.

These transitions are driven by changes in commensurability between the post spacing and BCP period, and are similar to those obtained from HSQ posts. This shows that the PS-brush effectively grafted onto the PMMA posts and provided the same boundary conditions as those obtained from PS-functionalized HSQ posts.

Figure 13A:
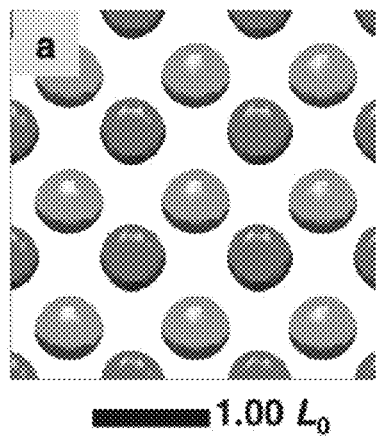
FIGS. 13A-13D show top-down 3D view of self-consistent field theory (SCFT) simulation results of PS-b-PDMS single-layer thin film equilibrium structures with PS-coated posts of different pitch.
Figure 13B:
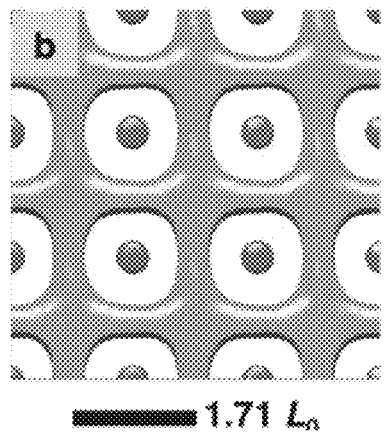
Figure 13C:
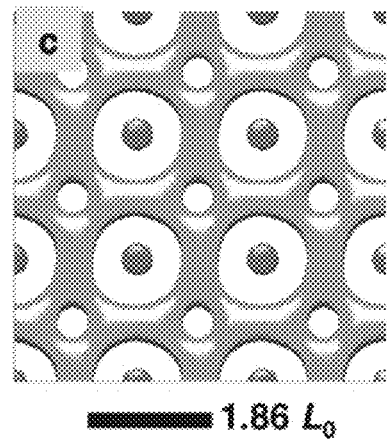
Figure 13D:
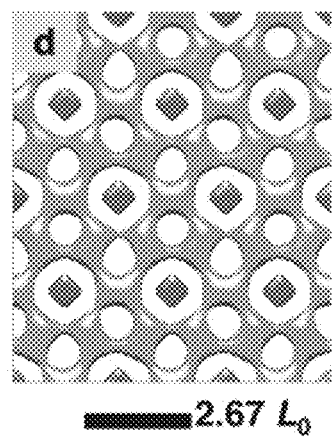
Figure 13E:
FIG. 13E provides a legend for FIGS. 13A-13D.

3D self-consistent field theory (SCFT) simulations were performed to gain insight into the effect of post pitch on the morphology, shape and size of the experimental nanostructures. FIGS. 13A-13D show simulation results analogous to the nanopatterns achieved in FIGS. 8, 11A, 12A, and 12B, which were produced by changing the ratio between the post spacing and $L_0$, the BCP equilibrium period. FIG. 13A shows a square array of spheres at pitch $L_0$; FIG. 13B shows a square symmetry perforated lamella L1 for post pitch of $1.71L_0$; FIG. 13C shows a square symmetry perforated lamella L2 for pitch $1.86L_0$; and FIG. 13D shows a hexagonal symmetry perforated lamella L2 for pitch $2.67L_0$. FIGS. 13A-13C are each made as a composite of 9 identical images and FIG. 13D is made as a composite of 6 identical images to show the geometry more clearly. $L_0$ is the cylinder pitch in the untemplated BCP.

These simulation results are based on a unit cell containing one or two posts and periodic boundary conditions, in which the posts and substrate surfaces are attractive to the majority block and the top (air) surface to the minority block. In the case of the structures in FIGS. 13A, 13B, and 13C, the square symmetry of the PDMS microdomains is driven by the square symmetry of the post array with period $<2L_0$, which provides a strong templating effect similar to previous work with square symmetry chemical patterns that promoted square symmetry arrays of cylindrical microdomains. The SCFT reproduced the trend in morphology from spheres to L1 and then L2 as seen experimentally with increasing template pitch, and also showed that the curvature and the shape of the hole produced around the posts was non-circular.

Perforated Lamellar Morphologies (L2).

In addition to cylindrical morphology BCP, embodiments of the subject methods can also be used with lamellar morphology. For example, the lamellae can be configured parallel or perpendicular to the surface of the substrate.

The perforated lamellar structures L2 as shown in FIGS. 12A and 12B provide interesting results because of the density multiplication of the holes compared to the posts, and because bimodal hole sizes can be produced. Here, two types of holes were identified: post-holes, which surround the posts, and generated-holes which formed between the posts. In FIGS. 12A and 12B each post generated an additional one and two holes, respectively.

Figure 14A:
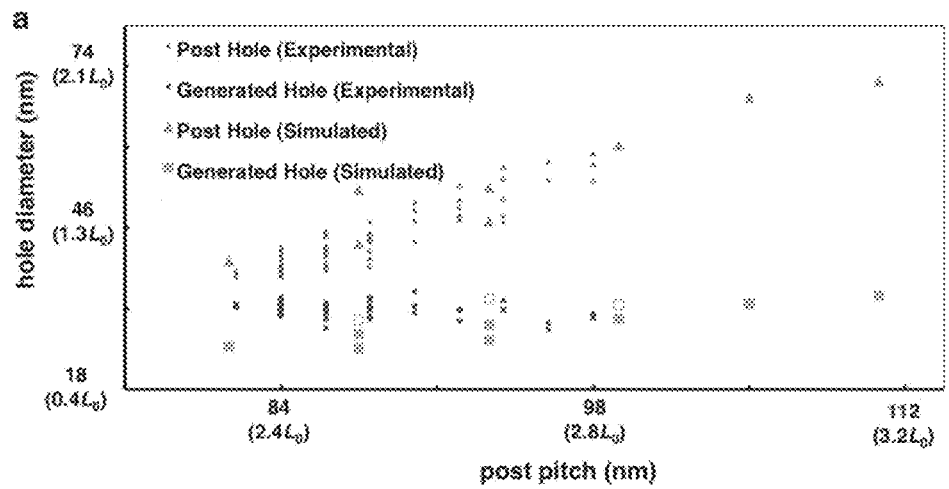
FIGS. 14A and 14B show graphs of experimental and simulated post-hole and generated-hole diameter versus the post pitch (FIG. 14A) and post diameter (FIG. 14B).
Figure 14B:
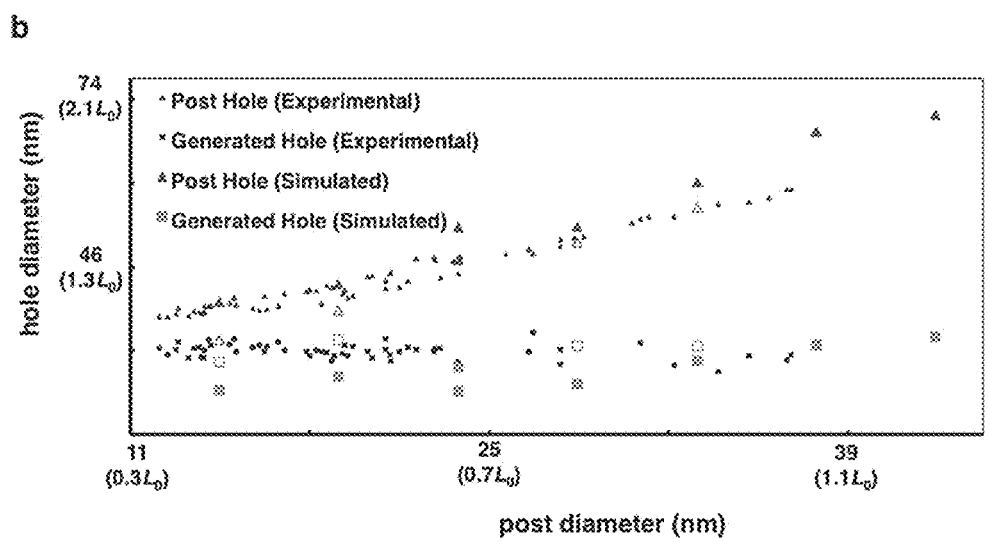

FIGS. 14A and 14B show how the sizes of the post-holes and generated-holes varied with the post pitch and diameter, respectively, for the hexagonal symmetry L2 perforated lamella of FIGS. 12B and 13D. Here the post pitch is the center-to-center distance between posts. Experimental data points were extracted from SEM images of samples having the L2 structure and simulated data points were determined from simulations which formed the L2 structure. The post diameter in the simulation was changed by increments of ~3 nm. However, the simulations examined a wider range of post pitches and post diameters than the experiment, up to 110 nm (~$3.2L_0$) and 43 nm (~$1.2L_0$), respectively, where $L_0$ is the cylinder spacing in the untemplated BCP, ~35 nm. Out of 12 simulations, 4 had defects in which two of the generated-holes connected. These data points are shown with a hollow triangle or diamond in the plot, and such defects were observed experimentally as well.

Figure 15:
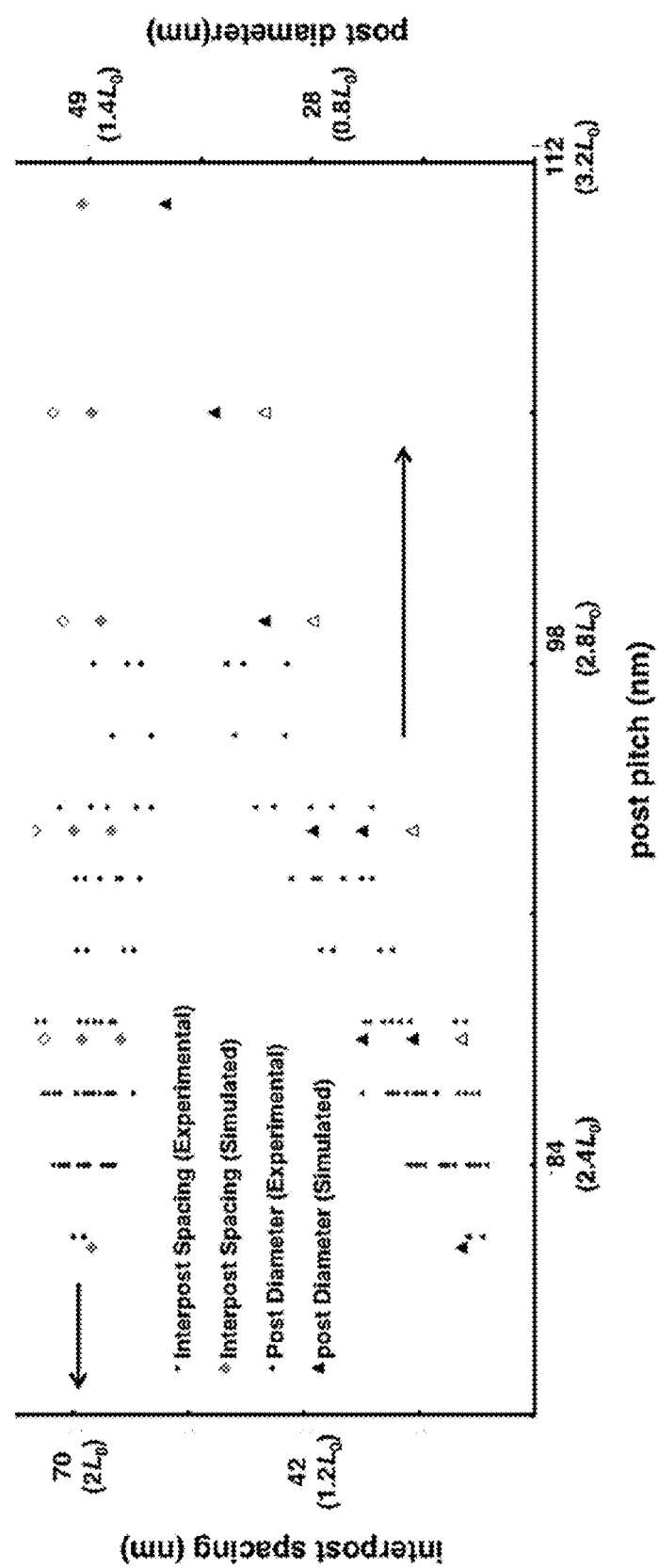
FIG. 15 shows the interpost spacing and post diameter versus the post pitch from the templates that produced the L2 hexagonal perforated lamellae discussed in FIGS. 14A and 14B. Other templates produced different morphologies. The experimental and simulation template geometries which produced the L2 perforated lamellae are shown plotted as data points of (post pitch, post diameter) or (post pitch, interpost spacing). The interpost spacing is defined as the difference between the post pitch and the post diameter. The L2 structure formed over a range of post pitch (between 2.3 and $3.2 L_0$) when the interpost spacing was around $2.0L_0$ and when the post diameter was between 0.3 and $1.2L_0$. The experimental data was based on samples with HSQ posts instead of PMMA posts. For the simulation data points, some simulations had defects where two of the generated holes connected. These data points are shown with a hollow triangle or diamond in the plot.

FIG. 15 shows the range of interpost spacings and diameters that produced L2 structures. The L2 structure formed in templates with an interpost spacing (i.e. the difference between post pitch and post diameter) of approximately $2L_0$ over a range of post pitches and diameters.

The general experimental observation was that the generated-holes had an approximately constant diameter, whereas the post-hole diameter increased with post pitch and post diameter, giving a bimodal hole size distribution. The post-holes were formed by the PS chains which surrounded each post, and their diameter therefore increased (linearly) as the posts became larger. In contrast, the generated-holes had an almost invariant diameter similar to that formed in an untemplated perforated lamella, and there would be a large entropic penalty for the chain extension needed to increase their size. The SCFT results agreed very well with the experimental results, and suggested that the trends in hole size extended to larger template pitch and diameter than the experimentally investigated range.

The minimum post pitch where the L2 perforated lamella was observed was ~80 nm. If a cylindrical BCP of period $L_0$ were to transition into a perforated lamella, the grow-spacing of the holes would be $L_0$ and the center-to-center distance between holes would be $L_0\sqrt{3}/2$, meaning a post pitch of at least $2L_0$ (70 nm) is necessary to allow to rows of holes to fit between each pair of posts and thus stabilize the normally metastable perforated lamellae structure. This commensurate condition stabilized the hexagonal L2 structure, which persisted to post pitches of at least 3.2 $L_0$ (in the model)=110 nm by accommodating the strain through increases in the post-hole diameter. The post template helps to stabilize the normally metastable perforated lamella due to the confinement effects.

Bilayer Microdomain Arrays

Bilayer structures were fabricated using the sacrificial-post templating method such as described with respect to FIG. 2B in which (Step 1) represents electron-beam lithography fabrication of arrays of posts, (Step 2) represents functionalization of posts and substrates with a PS brush, (Step 3) represents spin coating and solvent annealing of the PS-b-PDMS BCP thin film, and (Step 4) represents RIE removal of the top PDMS layer with $CF_4$ followed by PS matrix and PMMA posts removal with $O_2$. The ox-PDMS nanostructure remained on the substrates as the final nanopatterns.

Figure 16A:
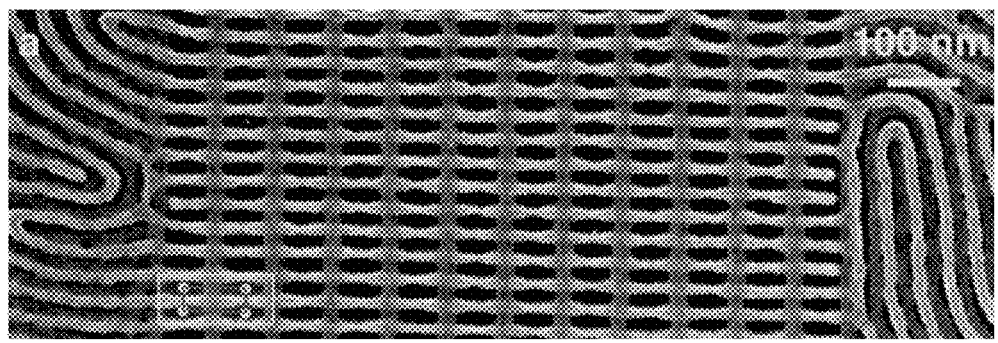
FIGS. 16A and 16B are SEM images of mesh/grating structures fabricated by the sacrificial-post templating method.
Figure 16B:
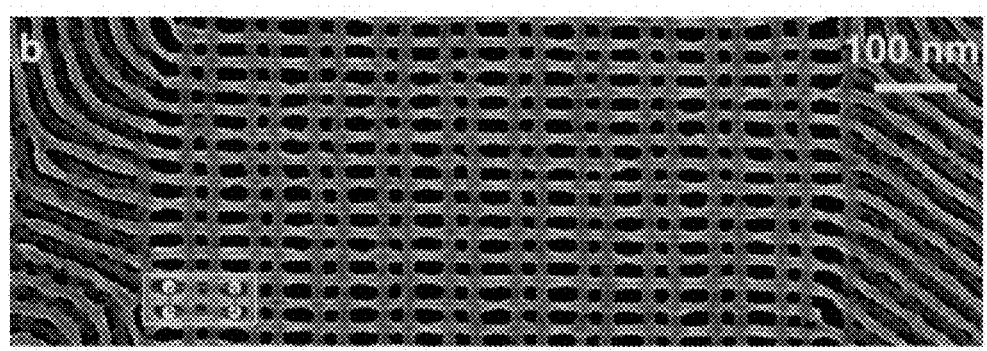

FIGS. 16A and 16B show the results of the bilayer mesh-shaped nanostructures after post removal (see e.g., FIG. 2B, Step 4). The mesh-shaped structures formed from a film that was thick enough to produce a bilayer of in-plane cylinders over the region of the substrate containing posts. The mesh formed when the post pitch in the diagonal or y-direction was equal to $L_0$, favoring alignment of one layer of cylinders perpendicular to the diagonal or y-direction, and the post period in the x-direction was slightly less than an integer multiple of $L_0$. The PMMA posts produced similar structures as when using the HSQ posts, but post removal left rectangular holes. This is in contrast to the untemplated regions of the substrate in which the upper and lower layer of cylinders were parallel without long range order, shown in the left and right sides of FIGS. 16A and 16B. Insets in these figures show the locations of posts before removal. FIG. 16B shows rectangular holes, with bimodal size distribution after etching bilayer structures, templated by posts with a larger x-spacing.

In particular, as shown in FIG. 18A, parallel cylinders were predicted by the SCFT simulation for x direction post periods equal to integer multiples of $L_0$. Perpendicular mesh-shaped structures were predicted for x direction periods less than an integer multiple of $L_0$ ($2L_0$, $3L_0$) and y direction periods equal to $L_0$, as shown in FIGS. 18B and 18C. Different morphologies in the two layers were also predicted by SCFT, such as cylinders over spheres (FIG. 18D) and cylinders over perforated lamellae (FIG. 18E). In the simulations shown in FIGS. 18B-18D, the cylinders in the two layers were often connected. Without wishing to be bound by theory, these connections between the two layers may be metastable defects. There is also experimental evidence in the mesh-shaped structures to support the existence of these connections. Thus, local connections between structures located in separate self-assembled layers are likely to be present in the system and may be considered in post-processing applications for these patterns.

Confinement Effects

According to certain embodiments, the post arrangement is configured while taking into consideration the commensuration with the equilibrium period $L_0$. Post period $P_x$ and $P_y$ in the x and y directions, respectively, can be commensurate with integer multiples of $L_0$, or within 9% of an integer multiple of $L_0$. In some cases, diagonal spacings can be configured to be commensurate with integer multiples of $L_0$. Commensurability in x and y direction plays a role in determining morphology formation; however, the use of the posts as boundary conditions—creating confinement effects—can be taken advantage of to create a periodic feature as well as periodic features that do not fall within an expected morphology associated with commensurate conditions. Accordingly, certain embodiments contemplate the intentional use of non-commensurate post periods to rely on confinement effects of the posts in forming localized non-bulk morphologies.

EXAMPLES

Materials and Methods

Template Fabrication

Initial sacrificial post templates were fabricated using electron beam lithography (EBL) of 40 nm thick films of PMMA as a negative-tone resist as described with respect to FIGS. 2A and 2B (Step 1).

For the fabricated samples, prime silicon (100) wafers were cut into pieces ~2 cm×2 cm and diluted PMMA was spin-coated onto the pieces. The PMMA (950 kg/mol in anisole) was diluted with a volumetric dilution ratio of about 1:8 PMMA:anisole. To produce 40 nm thickness films (measured by ellipsometer), a 4000 rpm spin coating speed was used. To evaporate the excess solvent and improve the adhesion between the PMMA resist and the substrate, the samples were baked on a hot plate at 200° C. for 2 min.

PMMA is typically a positive-tone resist; however PMMA can act as a negative-tone resist when exposed to doses of about 30 times the positive-tone dose and developed with methyl isobutyl ketone (MIBK) as part of a carbonization process. When PMMA is exposed at high dose levels (by, for example, an electron beam), there are three regions with respect to the beam spot: a highly exposed region near the beam spot from the primary beam and secondary electrons; a lightly exposed region in proximity to the beam spot from the backscattered electrons; and an unexposed region far from the beam spot.

Figure 17:
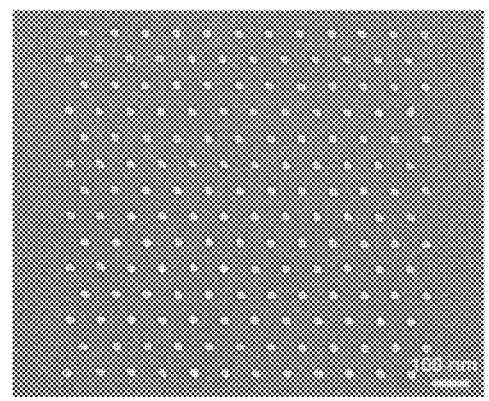
FIG. 17 is a SEM image of PMMA posts in a hexagonal array fabricated according to an embodiment of the invention.

For the samples, a RAITH-150 scanning electron beam lithography system from Raith GmbH was used at a 30 keV accelerating voltage, about 240 pA beam current, and a 6 mm working distance to expose the PMMA resist. 434-1240 fC/dot dose range was used for exposing square and hexagonal arrays of dots. After exposure, the substrates were developed in methyl isobutyl ketone (MIBK) for 2 min and rinsed in isopropanol (IPA) for 1 min. Development with MIBK removes the PMMA from the lightly exposed region; however to remove the PMMA from the unexposed region, the samples were sonicated in acetone for 2 min after development in MIBK. Acetone sonication removed the unexposed PMMA and left the posts on the substrates such as shown in FIG. 17, which provides a SEM image of PMMA posts on a Si substrate. The array of posts has a pitch of 86 nm before spin-coating of the BCP. For imaging, posts and substrate were sputtered with a thin layer of Au/Pd.

The diameter of each of the PMMA posts was between 17-30 nm and their height was around 30 nm after development. The RAITH-150 with an accelerating voltage of 10 keV and a working distance of 6 mm was used for imaging.

Chemical Functionalization

After forming the PMMA posts, the samples were functionalized with hydroxyl-terminated PS brush, PS-OH (1 kg $mol^{-1}$) by spin-coating the PS-OH then annealing for 14 hrs under vacuum at 170° C. (see e.g., FIGS. 2A and 2B, Step 2), which made the posts repulsive to the minority block (PDMS) and attractive to the majority block (PS). Tests conducted to verify that a hydroxyl-terminated polymer brush can be grafted onto cross-linked PMMA templates confirmed that cross-linked PMMA posts can be functionalized.

Application of BCP and Annealing

PS-b-PDMS (MW=45.5 kg mol$^{-1}$, $f_{PDMS}$=0.32, equilibrium period approximately 35 nm) was spin-coated onto substrates to average 30 nm thickness in order to achieve a single-layer of in-plane PDMS cylindrical microdomains on untemplated substrates, and 42 nm thick to obtain bilayers of cylinders. Solvent vapor annealing (SVA) was used to facilitate the self-assembly of the BCP thin films (see e.g., FIGS. 2A and 2B, Step 3).

The SVA was carried out using the vapor from a volumetric mixture of toluene and heptane (5:1) for 1.5 hrs at room temperature. This was performed on the samples using a simple beaker setup where a crystallization dish (1.5 cm in height, 5 cm in diameter) was used to contain the solvent and the thin film. The thin film was placed on a glass platform 0.6 cm from the base of the dish and 1.5 ml of a toluene and heptane mixture (5:1 toluene:heptane by volume) was placed in the chamber. The chamber was capped using a 10 cm glass petri dish which was placed over the top. The dish did not completely close off the solvent vapor from the environment, so leakage occurred at a rate of 590 μg/min as measured by tracking the mass of the system versus time.

Removal of Matrix Block and Sacrificial Posts

A CF$_4$ RIE was used to remove the PDMS surface wetting layer, immediately followed by an O$_2$ RIE to simultaneously remove the PS matrix and the PMMA posts and to oxidize the PDMS, leaving the final oxidized PDMS (ox-PDMS) nanopatterns on the surface (see e.g., FIGS. 2A and 2B, Step 4).

Reproducibility of Microdomain Morphologies

For the example samples, BCP nanopatterns—with the templates removed—were obtained showing microdomain morphologies equivalent to those produced with non-sacrificial post templates. A nearly 100% yield for the BCP nanopatterns was accomplished after addressing technical issues including: BCP solvent annealing issues such as thin film dewetting and islanding, inconsistent PDMS microdomain width, decreased BCP coherence length, and high PDMS line-width roughness; issues with PMMA removal (solved by removing unexposed PMMA by acetone sonication); and collapse of PMMA posts at inadequate EBL dot-doses.

The Table 1, below, outlines the conditions for achieving the results presented in the examples herein. The left column includes the different morphologies and the other columns list the post doses, pitches, and estimated diameters, which resulted in the given morphologies. L$_0$ was ~35 nm. All of the morphologies were achieved under these conditions more than once. Some of the morphologies were achieved many times over a wide range of doses and pitches, while others required a narrower window of doses and pitches for fabricating the posts.

TABLE 1

| Nanofeature Morphology | Dose (fC/dot) | Pitch [x-pitch, y-pitch] (nm) | Post Diameter (nm) |
| --- | --- | --- | --- |
| Circular Dots | 345.7-1328.21 | [41-50, 36-47] | 21-24 |
| Elliptical Dots | 1328.21-5102.45 | [44-60] | 23-27 |
| Lines | 484.04-14001.13 | [36-46] | |
| Periodic Superstructure | 90-677.66 | [50-59, 36-39] | 20-24 |
| Square Symmetry Perforated Lamella L1 | 90-1328.21 | [52-69, 43-64] | 15-50 |
| Square Symmetry Perforated Lamella L2 | 176.4-1328.21 | [65-75, 65-75] | 11-37 |
| Hexagonal Symmetry Perforated Lamella L1 | 90-5102.45 | [48-74] | 15-50 |
| Hexagonal Symmetry Perforated Lamella L2 | 246.96-3644.6 | [80-92] | 11-37 |
| Bilayer Mesh, one hole per post | 345.74-948.72 | [60-92, 34-38] | 14-23 |
| Bilayer Mesh, two holes per post | 126-677.65 | [92-107, 33-37] | 14-23 |

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A method of fabricating a self-assembled template, comprising:
   removing a material layer to form a pattern of sacrificial posts that physically extend from a substrate, the pattern configured to direct self-assembly of a block copolymer into a non-final pattern block and a remainder block, wherein the sacrificial posts each have a diameter;
   directly after removing the material layer to form the pattern of sacrificial posts, applying the block copolymer to the substrate having the pattern of sacrificial posts;
   annealing the substrate having the block copolymer and sacrificial posts so that the block copolymer forms the non-final pattern and the remainder block; and
   performing an etching process to concurrently remove the non-final pattern block of the block copolymer and the sacrificial posts such that the final pattern of the remainder block remains on the substrate.

2. The method of claim 1, wherein forming the pattern of sacrificial posts on the substrate comprises: applying a polymethylmethacrylate (PMMA) film; and performing electron beam lithography at a dose/energy that causes the PMMA film to behave as a negative resist to pattern the PMMA into the pattern of sacrificial posts on the substrate.

3. The method of claim 1, wherein the sacrificial posts are formed of a material having etching rate higher than material of the final pattern.

4. The method of claim 1, wherein the final pattern covers an entire area of the substrate on which a pattern is to be transferred.

5. The method of claim 1, wherein the final pattern comprises a monolayer of in-plane microdomains, including at least one of spheres, cylinders and perforated lamellae.

6. The method of claim 1, wherein the final pattern comprises perforated lamellae with bimodal hole size distribution and square, rectangular or hexagonal symmetries.

7. The method of claim 1, wherein the final pattern comprises a bilayer of cylinders forming a mesh structure.

8. A method of fabricating a nano-scale structure, comprising:
    forming a pattern of sacrificial posts in a topographical pattern extending from a substrate, wherein the sacrificial posts each have a diameter;
    directly after forming the pattern of sacrificial posts and optionally applying a chemical functionalization to a surface of the sacrificial posts, annealing a block copolymer on the substrate having the pattern of sacrificial posts to form a non-final pattern block and a remainder block; and
    concurrently removing the non-final pattern block of the block copolymer and the sacrificial posts, such that a final pattern of the remainder block remains on the substrate.

9. The method of claim 8, further comprising:
    etching the substrate using the final pattern.

10. The method of claim 9, wherein the substrate being etched using the final pattern does not include any physical template structures.

11. The method of claim 8, wherein the final pattern covers an entire area receiving a final pattern transfer.

12. The method of claim 8, wherein forming the pattern of sacrificial posts comprises:
    forming the sacrificial posts spaced apart on the substrate according to the equilibrium periodicity $L_0$ of the block copolymer, a pitch between adjacent posts being commensurate with integer multiples of $L_0$ or within 9% of an integer multiple of $L_0$, and/or intentionally non-commensurate with $L_0$.

13. The method of claim 12, further comprising:
    applying the chemical functionalization to the sacrificial posts.

14. The method of claim 13, wherein applying the chemical functionalization comprises:
    applying a surface layer having an affinity to the non-final pattern block on the sacrificial posts.

15. The method of claim 8, wherein the annealing of the block copolymer on the substrate having the pattern of sacrificial posts directs self-assembly of the block copolymer in a monolayer microdomain.

16. The method of claim 8, wherein the annealing of the block copolymer on the substrate having the pattern of sacrificial posts directs self-assembly of the block copolymer in a bilayer microdomain.

17. The method of claim 8, wherein the final pattern comprises perforated lamellae with bimodal hole size distribution and square, rectangular or hexagonal symmetries.

18. A method of fabricating a self-assembled template, comprising:
    removing a material layer to form a pattern of sacrificial posts that physically extend from a substrate, the pattern configured to direct self-assembly of a block copolymer into a non-final pattern block and a remainder block, wherein the sacrificial posts each have a diameter;
    performing a chemical functionalization with respect to the sacrificial posts;
    directly after performing the chemical functionalization, applying the block copolymer to the substrate having the pattern of sacrificial posts;
    annealing the substrate having the block copolymer and sacrificial posts so that the block copolymer forms the non-final pattern and the remainder block; and
    performing an etching process to concurrently remove the non-final pattern block of the block copolymer and the sacrificial posts such that the final pattern of the remainder block remains on the substrate.

19. The method of claim 18, wherein performing the chemical functionalization comprises:
    applying a surface layer having an affinity to the non-final pattern block on the sacrificial posts.

20. The method of claim 19, wherein the surface layer is selectively applied according to a desired morphology of the final pattern.

* * * * *